(12) United States Patent
Ikemoto et al.

(10) Patent No.: US 12,341,233 B2
(45) Date of Patent: Jun. 24, 2025

(54) SIGNAL TRANSMISSION LINE

(71) Applicant: Murata Manufacturing Co., Ltd., Nagaokakyo (JP)

(72) Inventors: Nobuo Ikemoto, Nagaokakyo (JP); Kanto Iida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 337 days.

(21) Appl. No.: 17/979,034

(22) Filed: Nov. 2, 2022

(65) Prior Publication Data
US 2023/0050989 A1 Feb. 16, 2023

Related U.S. Application Data

(63) Continuation of application No. PCT/JP2021/017817, filed on May 11, 2021.

(30) Foreign Application Priority Data

May 21, 2020 (JP) .................. 2020-088706

(51) Int. Cl.
*H01P 3/08* (2006.01)
(52) U.S. Cl.
CPC .................. *H01P 3/085* (2013.01)
(58) Field of Classification Search
CPC .......... H01P 3/082; H01P 3/085; H01P 3/088; H01P 7/082; H01Q 13/206

(Continued)

(56) References Cited

U.S. PATENT DOCUMENTS 6,816,385 B1 11/2004 Alcoe
2018/0309182 A1 10/2018 Iida et al.
(Continued)

FOREIGN PATENT DOCUMENTS

JP S5823403 U 2/1983
JP H07297541 A 11/1995
(Continued)

OTHER PUBLICATIONS

International Search Report in PCT/JP2021/017817, mailed Jul. 27, 2021, 3 pages.
(Continued)

*Primary Examiner* — Andrea Lindgren Baltzell
*Assistant Examiner* — Abigail Amir Yaldo
(74) *Attorney, Agent, or Firm* — Keating & Bennett, LLP

(57) ABSTRACT

A signal transmission line includes first and second base materials, and conductive bonding materials. The first base material includes a signal conductor. The second base material includes a ground conductor. The conductive bonding materials bond the first base and second base material to provide a gap. The first base material includes a mounting conductor to which the conductive bonding materials are respectively bonded. The mounting conductor includes a portion extending in parallel or substantially in parallel with the signal conductor on a side of a first side surface, and a portion extending in parallel or substantially in parallel with the signal conductor on a side of a second side surface. A position of a portion of the mounting conductor on the side of the first side surface and a position of a portion of the mounting conductor on the side of the second side surface are different from each other in a signal transmission direction.

15 Claims, 9 Drawing Sheets

(58) Field of Classification Search
USPC .......................................................... 333/238
See application file for complete search history.

(56) References Cited

U.S. PATENT DOCUMENTS

2019/0296414 A1* 9/2019 Xu .......................... H01P 3/026
2022/0232708 A1    7/2022 Ikemoto

FOREIGN PATENT DOCUMENTS

| JP | 2002237553 A | 8/2002 |
| JP | 2011160231 A | 8/2011 |
| WO | 2017130731 A1 | 8/2017 |
| WO | 2021095642 A1 | 5/2021 |

OTHER PUBLICATIONS

Written Opinion in PCT/JP2021/017817, mailed Jul. 27, 2021, 4 pages.

* cited by examiner

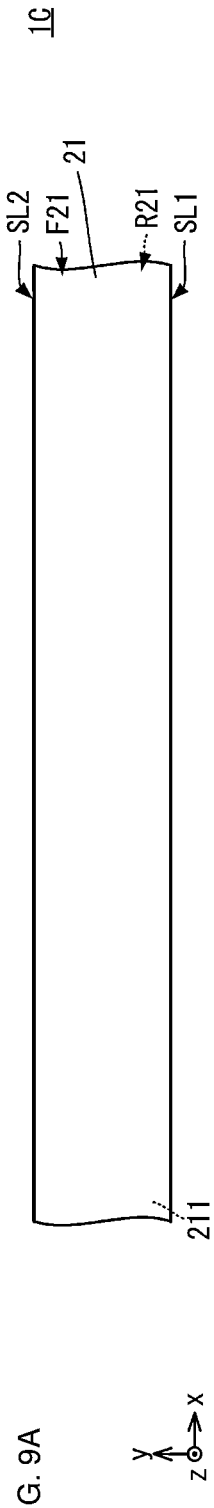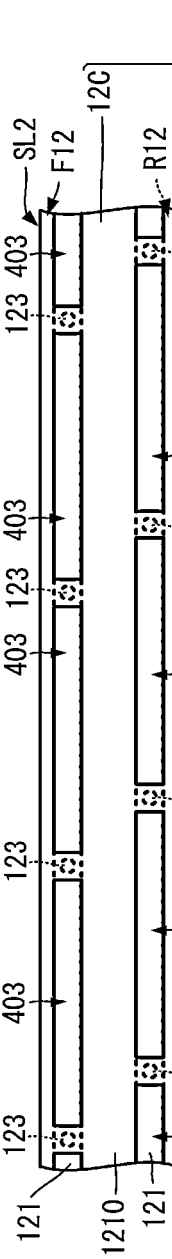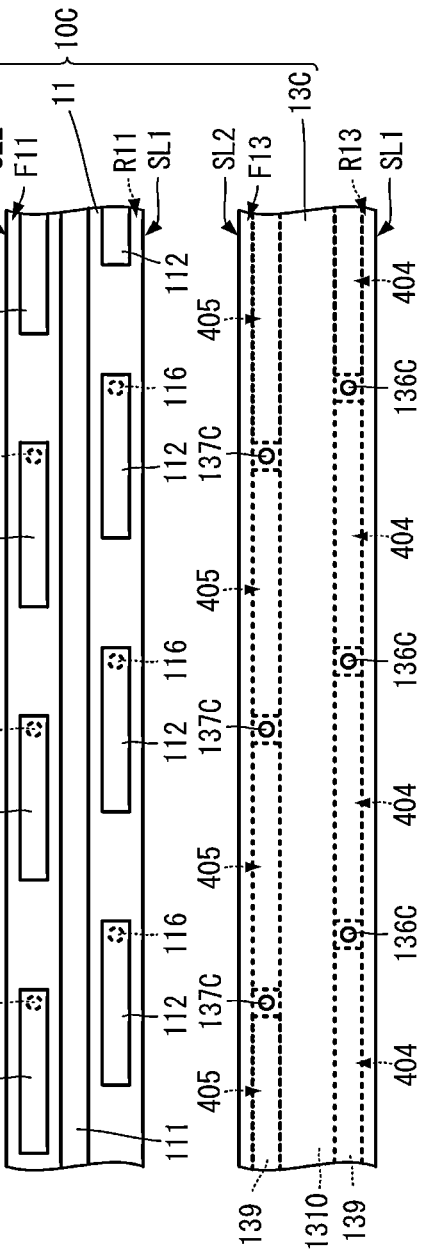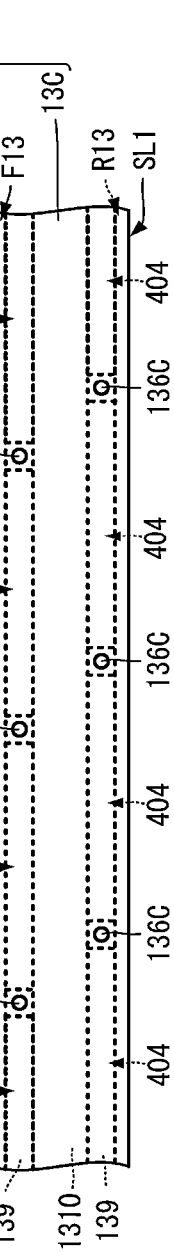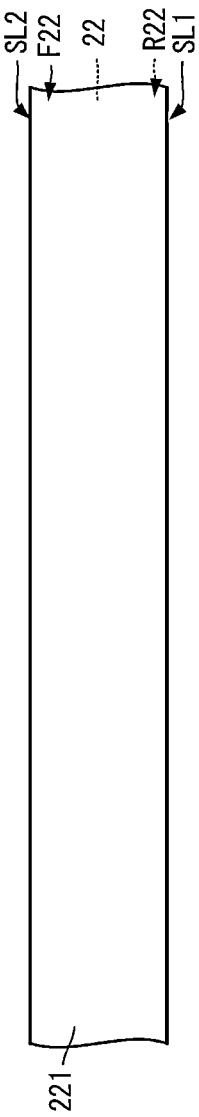

SIGNAL TRANSMISSION LINE

CROSS REFERENCE TO RELATED APPLICATIONS

This application claims the benefit of priority to Japanese Patent Application No. 2020-088706, filed on May 21, 2020, and is a Continuation Application of PCT Application No. PCT/JP2021/017817, filed on May 11, 2021. The entire contents of each application are hereby incorporated herein by reference.

BACKGROUND OF THE INVENTION

1. Field of the Invention

The present invention relates to a signal transmission line in which a conductor pattern is provided on an insulative base material.

2. Description of the Related Art

The signal transmission line described in International Publication No. 2017/130731 includes a hollow portion in a multilayer body. More specifically, the multilayer body is formed by laminating multiple resin layers. The signal transmission line includes a signal conductor and multiple ground conductors.

The signal conductor is on a first resin layer, and the multiple ground conductors are respectively on a second resin layer and a third resin layer.

The first resin layer is between the second resin layer and the third resin layer. The first resin layer and the second resin layer are bonded to each other with a gap therebetween. Further, the first resin layer and the third resin layer are bonded to each other with a gap therebetween.

The first resin layer and the second resin layer are bonded by multiple interlayer connection conductors in parallel with the signal conductor. The multiple interlayer connection conductors are at equal intervals along the signal conductor. Similarly, the first resin layer and the third resin layer are bonded by multiple interlayer connection conductors in parallel with the signal conductor. The multiple interlayer connection conductors are at equal intervals along the signal conductor.

However, the configuration described in International Publication No. 2017/130731 poses the following problem. The signal transmission line may be bent in the middle of an extending direction thereof such that a direction in parallel with a main surface of the multilayer body changes.

In the case above, the signal transmission line is unlikely to deform at a position where the multiple interlayer connection conductors are present, and is bent at a position where the multiple interlayer connection conductors are not present. With this, characteristic impedance greatly changes in a signal transmission direction, and transmission characteristics of the signal transmission line may deteriorate.

SUMMARY OF THE INVENTION

Preferred embodiments of the present invention provide signal transmission lines in each of which a large change in characteristic impedance in a signal transmission direction is unlikely to occur.

A signal transmission line according to a preferred embodiment of the present invention includes a first base material, a second base material, and multiple first conductive bonding materials. The first base material includes a first main surface, a second main surface, a first side surface, and a second side surface, and includes a first signal conductor of a shape in parallel or substantially in parallel with the first main surface and the second main surface. The second base material opposes the first main surface, and a first ground conductor is provided thereon. The multiple first conductive bonding materials bond the first base material and the second base material to include a gap between the first main surface and the second base material. The first base material includes multiple first mounting conductors and multiple second mounting conductors to which the multiple first conductive bonding materials are respectively bonded, on the first main surface. The multiple first mounting conductors extend in parallel or substantially in parallel with the first signal conductor, have multiple first non-mounting portions arranged with an interval in-between, and are arranged on a side of the first side surface relative to the first signal conductor. The multiple second mounting conductors extend in parallel or substantially in parallel with the first signal conductor, have multiple second non-mounting portions arranged with an interval in-between, and are located on a side of the second side surface relative to the first signal conductor. Positions of the multiple first non-mounting portions and positions of the multiple second non-mounting portions are different from each other in an extending direction of the first signal conductor.

In the configuration described above, positions at which the first base material and the second base material are bonded with the multiple first mounting conductors and positions at which the first base material and the second base material are bonded with the multiple second mounting conductors are different from each other, in an extending direction of a signal conductor. With this, it is possible to eliminate a portion at which the first base material and the second base material are not bonded to each other in the extending direction of the signal conductor. Accordingly, it is possible to reduce or prevent the formation of a portion which is likely to locally bend in the extending direction of the signal conductor.

According to preferred embodiments of the present invention, it is possible to provide signal transmission lines in each of which a large change in characteristic impedance in a signal transmission direction is unlikely to occur.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 9A to 9E are exploded plan views of a signal transmission line according to a fourth preferred embodiment of the present invention.

DETAILED DESCRIPTION OF THE PREFERRED EMBODIMENTS

First Preferred Embodiment

Figure 1:
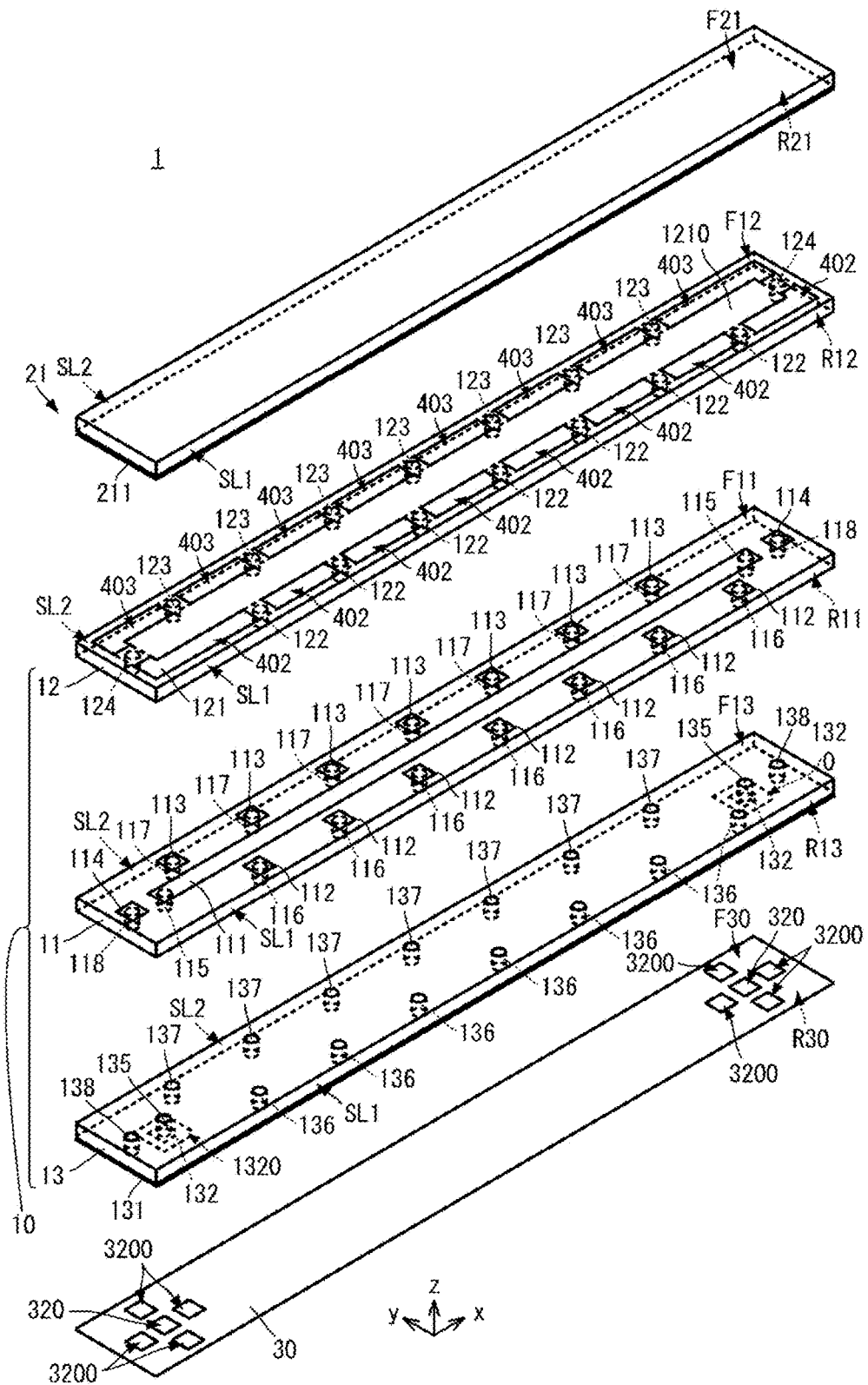
FIG. 1 is an exploded perspective view of a signal transmission line according to a first preferred embodiment of the present invention.
Figure 2:
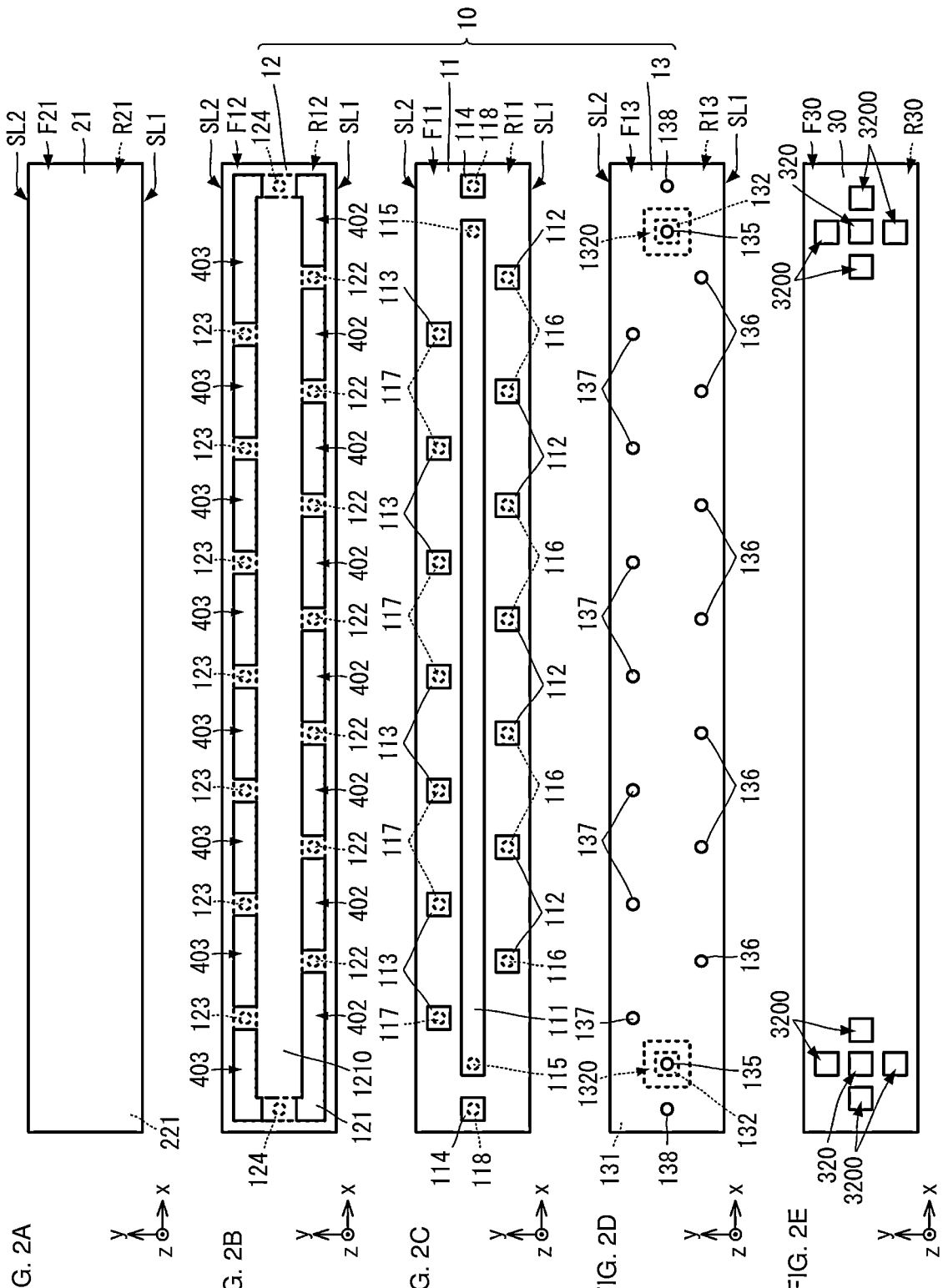
FIGS. 2A to 2E are exploded plan views of the signal transmission line according to the first preferred embodiment of the present invention.
Figure 3:
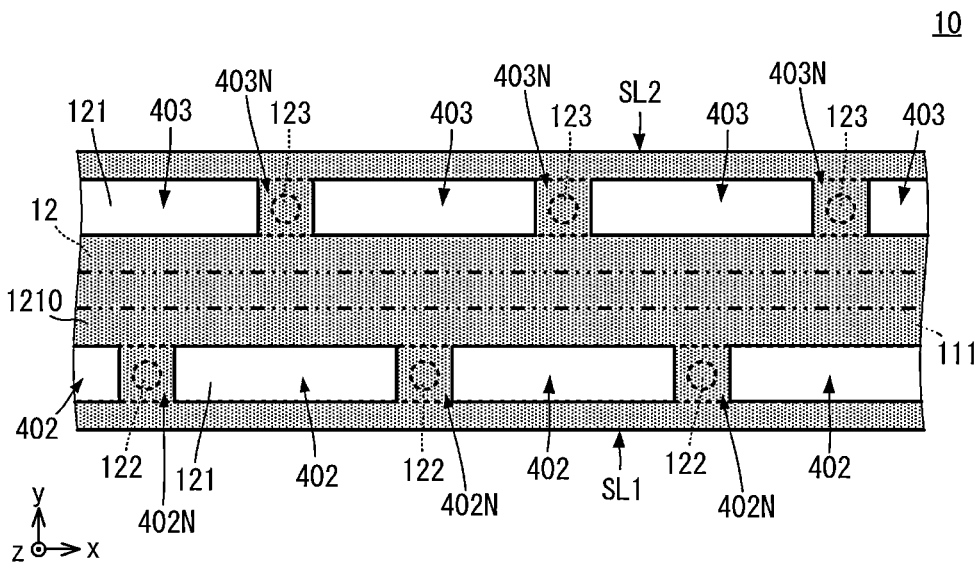
FIG. 3 is a partially enlarged plan view of a first base material according to the first preferred embodiment of the present invention.
Figure 4A:
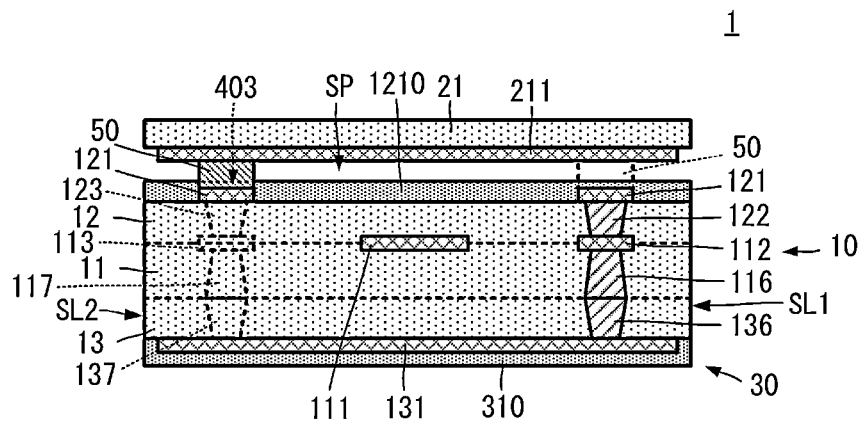
FIGS. 4A and 4B are sectional views of the signal transmission line according to the first preferred embodiment of the present invention.
Figure 4B:
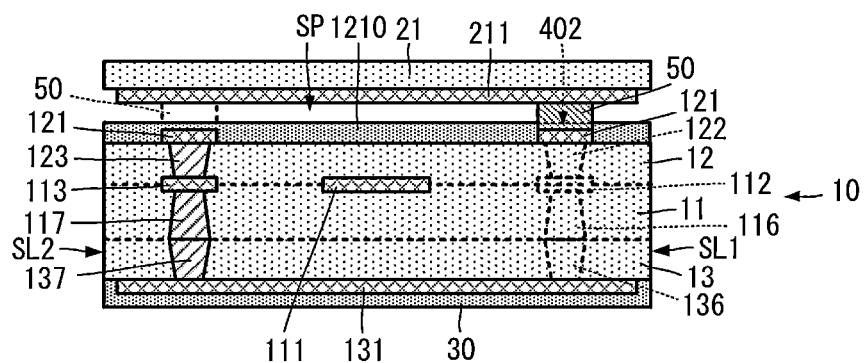

A signal transmission line according to a first preferred embodiment of the present invention will be described with reference to the drawings. FIG. 1 is an exploded perspective view of a signal transmission line 1 according to the first preferred embodiment. FIGS. 2A to 2E are exploded plan views of the signal transmission line 1 according to the first preferred embodiment. FIG. 3 is a partially enlarged plan view of a first base material 10 according to the first preferred embodiment. FIGS. 4A and 4B are sectional views of the signal transmission line 1 according to the first preferred embodiment. FIGS. 4A and 4B are sectional views taken along a plane orthogonal to an extending direction of a signal conductor 111 in the signal transmission line 1. The position in FIG. 4A and the position in FIG. 4B are different from each other in the extending direction of the signal conductor 111. Note that, in each preferred embodiment including the present preferred embodiment, a shape of each constituent is partially or wholly exaggerated in each drawing in order to facilitate the understanding of the configuration of the signal transmission line.

As illustrated in FIG. 1, FIGS. 2A to 2E, FIG. 3, FIGS. 4A and 4B, the signal transmission line 1 includes the first base material 10, a second base material 21, a protection film 30, and multiple conductive bonding materials 50.

Configuration of First Base Material 10

The first base material 10 preferably has a shape extending in a predetermined direction (x-axis direction in the drawing), for example. In other words, a length in the x-axis direction of the first base material 10 is larger than a length in a y-axis direction. The y-axis direction is a direction orthogonal or substantially orthogonal to the x-axis direction and orthogonal or substantially orthogonal to a z-axis direction which is a thickness direction of the first base material 10. The shape of the first base material 10 is not limited thereto.

The first base material 10 includes multiple insulation layers (insulation layer 11, insulation layer 12, and insulation layer 13). Each of the multiple insulation layers 11, 12, and 13 has flexibility. The multiple insulation layers 11, 12, and 13 are made of a thermoplastic resin including a liquid crystal polymer as a main component, for example. The multiple insulation layers 11, 12, and 13 may be made of other materials as long as having flexibility. Here, the flexibility refers to a property of being able to bend without breaking in response to a predetermined external force.

The multiple insulation layers 11, 12, and 13 are laminated in the order of the insulation layer 12, the insulation layer 11, and the insulation layer 13 in the thickness direction (z-axis direction) of the first base material 10.

The insulation layer 11 has a first main surface F11 and a second main surface R11. The signal conductor 111, multiple auxiliary conductors 112, multiple auxiliary conductors 113, and multiple auxiliary conductors 114 are on the first main surface F11 of the insulation layer 11. The signal conductor 111, the multiple auxiliary conductors 112, the multiple auxiliary conductors 113, and the multiple auxiliary conductors 114 are preferably formed of copper foil or the like, for example. The signal conductor 111 corresponds to a "first signal conductor".

The signal conductor 111 is a linear conductor extending in the x-axis direction. The signal conductor 111 is preferably at a center or substantially at a center position of the insulation layer 11 in the y-axis direction. In other words, the signal conductor 111 is between a first side surface SL1 and a second side surface SL2 of the insulation layer 11.

The multiple auxiliary conductors 112 are preferably rectangular or substantially rectangular in a plan view. The multiple auxiliary conductors 112 are on a side of the first side surface SL1 relative to the signal conductor 111. In other words, the multiple auxiliary conductors 112 are between the signal conductor 111 and the first side surface SL1 in a plan view. The multiple auxiliary conductors 112 are disposed along the extending direction (x-axis direction) of the signal conductor 111. The multiple auxiliary conductors 112 are at intervals along an arrangement direction.

The multiple auxiliary conductors 113 are preferably rectangular or substantially rectangular in a plan view. The multiple auxiliary conductors 113 are on a side of the second side surface SL2 relative to the signal conductor 111. In other words, the multiple auxiliary conductors 113 are between the signal conductor 111 and the second side surface SL2 in a plan view. The multiple auxiliary conductors 113 are disposed along the extending direction (x-axis direction) of the signal conductor 111. The multiple auxiliary conductors 113 are at intervals along an arrangement direction.

Positions of the multiple auxiliary conductors 112 are different from positions of the multiple auxiliary conductors 113 in the extending direction of the signal conductor 111 (x-axis direction). More specifically, the auxiliary conductors 112 and the auxiliary conductors 113 are alternately in the extending direction of the signal conductor 111.

The multiple auxiliary conductors 114 are at two ends of the insulation layer 11 in the x-axis direction. More specifically, one auxiliary conductor 114 is between one end of the signal conductor 111 and one end surface of the insulation layer 11, and the other auxiliary conductor 114 is between the other end of the signal conductor 111 and the other end surface of the insulation layer 11.

Interlayer connection conductors 115, multiple interlayer connection conductors 116, multiple interlayer connection conductors 117, and interlayer connection conductors 118 are provided in the insulation layer 11 in shapes penetrating through from the first main surface F11 to the second main surface R11. The multiple interlayer connection conductors 115, the multiple interlayer connection conductors 116, the multiple interlayer connection conductors 117, and the multiple interlayer connection conductors 118 are realized by solidifying a conductive paste filled in through-holes penetrating through the insulation layer 11 in the thickness direction.

The interlayer connection conductors 115 overlap with respective ends of the signal conductor 111 in a plan view. First ends of the interlayer connection conductors 115 are respectively connected to the signal conductor 111.

The multiple interlayer connection conductors 116 respectively overlap with the multiple auxiliary conductors 112 in a plan view. First ends of the multiple interlayer connection conductors 116 are respectively connected to the multiple auxiliary conductors 112.

The multiple interlayer connection conductors 117 respectively overlap with the multiple auxiliary conductors 113 in a plan view. First ends of the multiple interlayer connection conductors 117 are respectively connected to the multiple auxiliary conductors 113.

The interlayer connection conductors 118 respectively overlap with the multiple auxiliary conductors 114 in a plan view. First ends of the interlayer connection conductors 118 are respectively connected to the multiple auxiliary conductors 114.

The insulation layer 12 has a first main surface F12 and a second main surface R12. The second main surface R12 of the insulation layer 12 is in contact with the first main surface F11 of the insulation layer 11.

A mounting conductor 121 is on the first main surface F12 of the insulation layer 12. The mounting conductor 121 is formed of copper foil or the like, for example. The mounting conductor 121 is an annular conductor pattern and has a shape extending along the end surface, the first side surface SL1, and the second side surface SL2 of the insulation layer 12. The mounting conductor 121 overlaps with the multiple auxiliary conductors 112, the multiple auxiliary conductors 113, and the multiple auxiliary conductors 114 of the insulation layer 11 in a plan view. Further, the mounting conductor 121 does not overlap with the signal conductor 111, but surrounds the signal conductor 111 in a plan view. In a plan view, a portion of the mounting conductor 121 on the side of the first side surface SL1 relative to the signal conductor 111 corresponds to a "first mounting conductor". In a plan view, a portion of the mounting conductor 121 on the side of the second side surface SL2 relative to the signal conductor 111 corresponds to a "second mounting conductor".

A protection film 1210 is provided on the first main surface F12 of the insulation layer 12. The protection film 1210 has multiple opening portions 402 and multiple opening portions 403. The protection film 1210 is realized by a so-called resist film, for example.

The multiple opening portions 402 overlap with a portion of the mounting conductor 121 on the side of the first side surface SL1, and expose the mounting conductor 121. The multiple opening portions 402 are arranged with an interval in-between along a portion of the mounting conductor 121 that is close to the first side surface SL1 and extends along the first side surface SL1. Intervals of the multiple opening portions 402 are arranged equal to each other, for example. Further, a portion between the multiple opening portions 402 where the mounting conductor 121 is not exposed is a non-opening portion 402N (refer to FIG. 3, for example).

The multiple opening portions 403 overlap with a portion of the mounting conductor 121 on the side of the second side surface SL2, and expose the mounting conductor 121. The multiple opening portions 403 are arranged with an interval in-between along a portion of the mounting conductor 121 that is close to the second side surface SL2 and extends along the second side surface SL2. Intervals of the multiple opening portions 403 are arranged equal to each other, for example. Further, a portion between the multiple opening portions 403 where the mounting conductor 121 is not exposed is a non-opening portion 403N (refer to FIG. 3, for example).

Positions of the multiple non-opening portions 402N (corresponding to "first non-mounting portions") and positions of the multiple non-opening portions 403N (corresponding to "second non-mounting portions" are different from each other, and do not overlap with each other in the extending direction (x-axis direction) of the signal conductor 111. More specifically, the multiple non-opening portions 402N and the multiple non-opening portions 403N are alternately arranged in the extending direction (x-axis direction) of the signal conductor 111.

In other words, a region of the multiple opening portions 402 and a region of the multiple opening portions 403 overlap with each other not entirely, but partially in the extending direction of the signal conductor 111 (x-axis direction).

Multiple interlayer connection conductors 122, multiple interlayer connection conductors 123, and multiple interlayer connection conductors 124 are provided in the insulation layer 12 in shapes penetrating through from the first main surface F12 to the second main surface R12. The multiple interlayer connection conductors 122, the multiple interlayer connection conductors 123, and the multiple interlayer connection conductors 124 are provided by solidifying a conductive paste filled in through-holes penetrating through the insulation layer 12 in the thickness direction.

The multiple interlayer connection conductors 122 respectively overlap with the multiple non-opening portions 402N of the mounting conductor 121 in a plan view. First ends of the multiple interlayer connection conductors 122 are respectively connected to portions of the mounting conductor 121 overlapping with the non-opening portions 402N. Second ends of the multiple interlayer connection conductors 122 are respectively connected to the multiple auxiliary conductors 112 of the insulation layer 11.

The multiple interlayer connection conductors 123 respectively overlap with the multiple non-opening portions 403N of the mounting conductor 121 in a plan view. First ends of the multiple interlayer connection conductors 123 are respectively connected to portions of the mounting conductor 121 overlapping with the non-opening portions 403N. Second ends of the multiple interlayer connection conductors 123 are respectively connected to the multiple auxiliary conductors 113 of the insulation layer 11.

The multiple interlayer connection conductors 124 respectively overlap with portions of the mounting conductor 121 extending along end portions of the insulation layer 12 in a plan view. First ends of the multiple interlayer connection conductors 124 are respectively connected to the mounting conductor 121. Second ends of the multiple interlayer connection conductors 124 are respectively connected to the multiple auxiliary conductors 114 of the insulation layer 11.

The insulation layer 13 has a first main surface F13 and a second main surface R13. The first main surface F13 of the insulation layer 13 is in contact with the second main surface R11 of the insulation layer 11.

A ground conductor 131 and multiple terminal conductors 132 are on the second main surface R13 of the insulation layer 13. The ground conductor 131 and the multiple terminal conductors 132 are physically and electrically separated from each other by a conductor non-forming portion 1320. The ground conductor 131 and the multiple terminal conductors 132 are formed of copper foil or the like, for example.

The ground conductor 131 is disposed on the entire or substantially the entire second main surface R13. The multiple terminal conductors 132 are rectangular or substantially rectangular conductor patterns and overlap with respective ends of the signal conductor 111 in a plan view.

Multiple interlayer connection conductors 135, multiple interlayer connection conductors 136, multiple interlayer connection conductors 137, and multiple interlayer connection conductors 138 are provided in the insulation layer 13 in shapes penetrating through from the first main surface F13 to the second main surface R13. The multiple interlayer connection conductors 135, the multiple interlayer connection conductors 136, the multiple interlayer connection conductors 137, and the multiple interlayer connection conductors 138 are provided by solidifying a conductive paste filled in through-holes penetrating through the insulation layer 13 in the thickness direction.

The multiple interlayer connection conductors 135 respectively overlap with the multiple terminal conductors 132 in a plan view. First ends of the multiple interlayer connection conductors 135 are respectively connected to the multiple terminal conductors 132. Second ends of the multiple interlayer connection conductors 135 are connected to the interlayer connection conductors 115 of the insulation layer 11.

The multiple interlayer connection conductors 136 respectively overlap with the ground conductor 131 in a plan view. The multiple interlayer connection conductors 136 are in the vicinity of and along the first side surface SL1 of the insulation layer 13. First ends of the multiple interlayer connection conductors 136 are respectively connected to the ground conductor 131. Second ends of the multiple interlayer connection conductors 136 are respectively connected to the multiple interlayer connection conductors 116 of the insulation layer 11.

The multiple interlayer connection conductors 137 respectively overlap with the ground conductor 131 in a plan view. The multiple interlayer connection conductors 137 are in the vicinity of and along the second side surface SL2 of the insulation layer 13. First ends of the multiple interlayer connection conductors 137 are respectively connected to the ground conductor 131. Second ends of the multiple interlayer connection conductors 137 are respectively connected to the multiple interlayer connection conductors 117 of the insulation layer 11.

The multiple interlayer connection conductors 138 respectively overlap with the ground conductor 131 in a plan view. The multiple interlayer connection conductors 138 are in the vicinities of respective end surfaces of the insulation layer 13. First ends of the multiple interlayer connection conductors 138 are respectively connected to the ground conductor 131. Second ends of the multiple interlayer connection conductors 138 are respectively connected to the multiple interlayer connection conductors 118 of the insulation layer 11.

Configuration of Second Base Material 21

The second base material 21 has an insulation property and flexibility. The planar shape of the second base material 21 is preferably the same or substantially the same as the planar shape of the first base material 10, for example.

The second base material 21 includes a main surface F21 and a main surface R21. A ground conductor 211 is provided on the main surface R21 of the second base material 21. The ground conductor 211 is provided on the entire or substantially the entire main surface R21. The ground conductor 211 is made of copper foil or the like, for example.

Configuration of Protection Film 30

The protection film 30 is preferably a resist film. The protection film 30 includes multiple opening portions for terminal 320. The multiple opening portions for the terminal 320 are arranged near respective ends of the protection film 30.

The protection film 30 is on the second main surface R13 of the insulation layer 13. In the case above, the multiple opening portions for terminal 320 of the protection film 30 overlap with the multiple terminal conductors 132. Further, the protection film 30 has opening portions for the ground 3200 around the opening portion for the terminal 320 at positions overlapping with the ground conductor 131. The opening portions for the ground 3200 enable the ground conductor 131 to be connected to an external ground conductor or the like.

Connection Structure of First Base Material 10 and Second Base Material 21

The first base material 10 and the second base material 21 are electrically and physically connected to each other by the multiple conductive bonding materials 50 (corresponding to "first conductive bonding materials"). More specifically, the second base material 21 is on the first base material 10 such that the main surface R21 opposes the first main surface F12 (corresponding to the first main surface of the first base material 10) of the insulation layer 12 of the first base material 10.

The conductive bonding materials 50 are respectively bonded to the multiple opening portions 402 and opening portions 403 provided on the mounting conductor 121. The conductive bonding materials 50 above are also bonded to the ground conductor 211 of the second base material 21. With this, the mounting conductor 121 and the ground conductor 211 are electrically and physically connected to each other by the conductive bonding materials 50.

With the configuration described above, the signal transmission line 1 may be a stripline transmission line in which the signal conductor 111 is sandwiched by the ground conductor 211 and the ground conductor 131 from both sides in the thickness direction (z-axis direction).

Further, in this configuration, a gap SP is preferably provided between the first base material 10 and the second base material 21 by adjusting the amount of the conductive bonding materials 50 as illustrated in FIGS. 4A and 4B. That is, a structure including the gap SP between the signal conductor 111 and the ground conductor 211 may be realized. With this, dielectric loss may be decreased and transmission characteristics may be improved in the signal transmission line 1.

Further, when a desired impedance line is provided, the thickness of the signal transmission line may be made smaller than a case that the gap SP is not present, with the same line width of the signal line. Furthermore, having the gap SP allows the signal transmission line 1 to be easily bent. Here, the bending structure means that the signal transmission line 1 is bent in the middle of the extending direction such that a direction in parallel with the main surfaces (main surface of the first base material 10 and main surface of the second base material 21) of the signal transmission line 1 changes.

Further, in the configuration above, the multiple opening portions 402 and the multiple opening portions 403 are arranged at different positions in the extending direction of the signal conductor 111.

With this, in the extending direction (x-axis direction) of the signal conductor 111, the portions at which the first base material 10 and the second base material 21 are connected by the multiple conductive bonding materials 50 are different in a first side and a second side below. The first side is the side of the first side surface SL1 of the signal conductor 111 in which the first base material 10 and the second base material 21 are connected through the multiple opening portions 402. The second side is the side of the second side surface SL2 of the signal conductor 111 in which the first base material 10 and the second base material 21 are connected through the multiple opening portions 403. More specifically, portions bonded by the conductive bonding materials 50 on the side of the first side surface SL1 of the signal conductor 111 and portions bonded by the conductive bonding materials 50 on the side of the second side surface SL2 of the signal conductor 111 partially overlap with each other and do not overlap with each other in some areas, in the extending direction of the signal conductor 111.

In other words, in the extending direction (x-axis direction) of the signal conductor 111, the portions at which the first base material 10 and the second base material 21 are not connected to each other are different in a first side and a second side below. The first side is the side of the first side surface SL1 of the signal conductor 111 in which the multiple non-opening portions 402N do not connect the first base material 10 and the second base material 21. The second side is the side of the second side surface SL2 of the signal conductor 111 in which the multiple non-opening portions 403N do not connect the first base material 10 and the second base material 21.

With this, the portions on both sides of the signal conductor 111, at which the first base material 10 and the second base material 21 are not connected, do not coincide with each other. Accordingly, there is no portion at which the first base material 10 and the second base material 21 are not connected to each other in the extending direction of the signal conductor 111, that is, in the extending direction of the signal transmission line 1. As a result, it is possible to prevent a portion, which is much more likely to bend relative to other portions, from being locally provided in the signal transmission direction (x-axis direction) in the signal transmission line 1. That is, formation of a locally bent portion may be reduced or prevented, and a large change in characteristic impedance in the signal transmission direction may be reduced or prevented in the signal transmission line 1.

Further, in the configuration above, the portions at which the first base material 10 and the second base material 21 are not connected, that is, the non-opening portions 402N and the non-opening portions 403N respectively overlap with the interlayer connection conductors 122 and the interlayer connection conductors 123. With this, the interlayer connection conductors 122 or the interlayer connection conductors 123 are at places where the conductive bonding materials 50 are not present, and variation in strength against bending in the signal transmission direction may further be reduced or prevented. Accordingly, formation of a locally bent portion may further be reduced or prevented, and a change in characteristic impedance in the signal transmission direction may further be reduced or prevented in the signal transmission line 1. Further, with the configuration above, an occurrence of a large stress against bending in the interlayer connection conductor 122 and the interlayer connection conductor 123 may be reduced or prevented and the reliability of the signal transmission line 1 increases.

In the configuration described above, the protection film 1210 overlaps with the signal conductor 111. However, it may also be preferable that the protection film 1210 do not overlap with the signal conductor 111. For example, an opening may be provided in the protection film 1210 at a portion overlapping with the signal conductor 111. The opening above is preferably as large as possible within a range in which each of the opening portions 402 and opening portions 403 described above may individually be formed. With this, the area of the protection film 1210 between the signal conductor 111 and the ground conductor 211 may be decreased, and the effect of reducing the dielectric loss described above increases.

Manufacturing Method of Signal Transmission Line 1

Figure 5A:
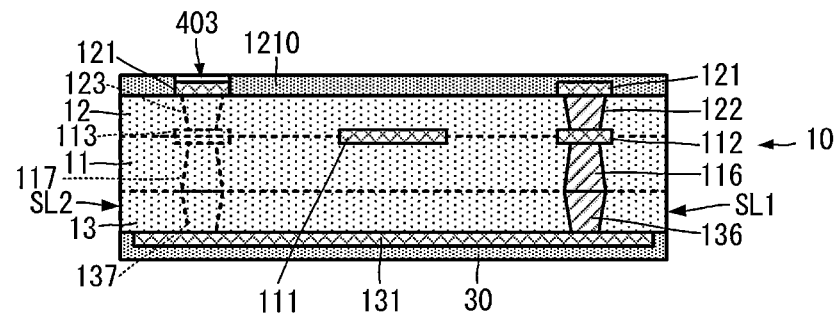
FIGS. 5A to 5C are sectional views of the signal transmission line illustrating configurations in respective processes in a manufacturing method.
Figure 5B:
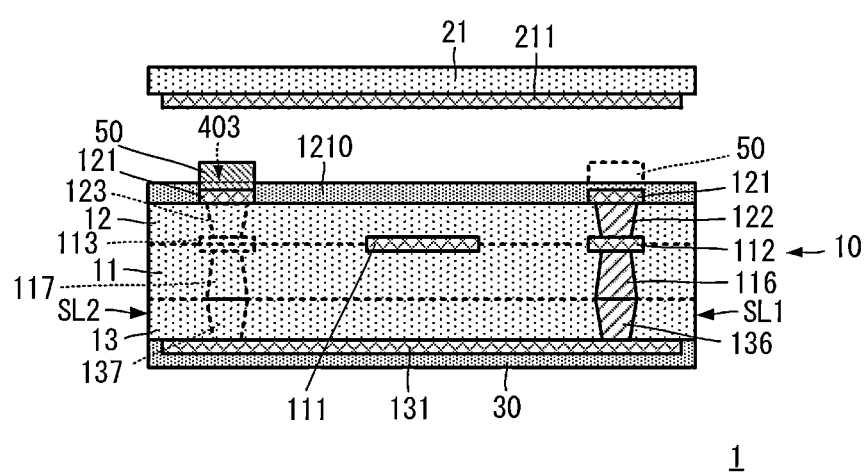
Figure 5C:
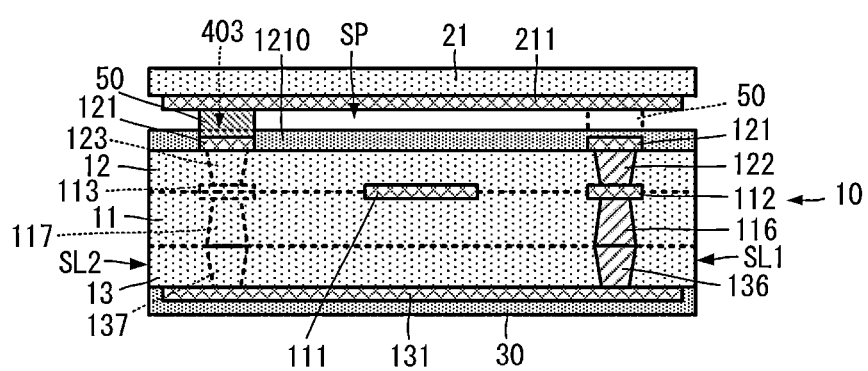

FIGS. 5a to 5C are sectional views of the signal transmission line 1 illustrating configurations in respective processes in a non-limiting example of a manufacturing method.

First, as illustrated in FIG. 5A, multiple insulation layers 11, 12, and 13, each having a predetermined conductor formed thereon, are laminated, heated and pressurized to form a multilayer body. Next, the protection film 1210 and the protection film 30 are formed on the multilayer body. At this time, as described above, the multiple opening portions 402 and the multiple opening portions 403 are formed on the protection film 1210 to expose part of the mounting conductor 121.

Next, as illustrated in FIG. 5B, the conductive bonding materials 50, that is solder for example, are applied to the multiple opening portions 402 and the multiple opening portions 403. Then, the second base material 21 is provided such that the side of the ground conductor 211 opposes the side of the first base material 10, and is brought close to the first base material 10.

Next, as illustrated in FIG. 5C, the conductive bonding materials 50 are solidified while maintaining the state in which the first base material 10 and the second base material 21 are structured with a gap SP therebetween.

By the manufacturing method described above, the signal transmission line 1 having the configuration described above may be manufactured.

Usage Example of Signal Transmission Line 1

Figure 6:
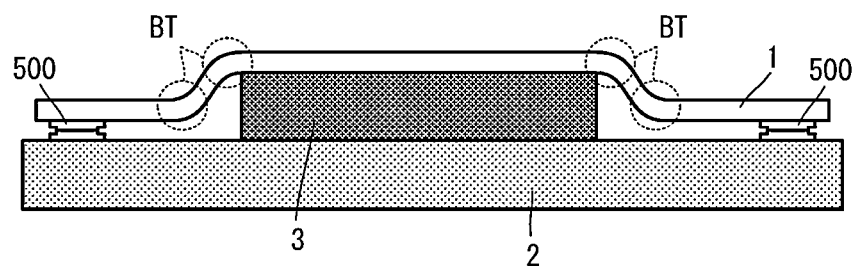
FIG. 6 is a side view of the signal transmission line illustrating a usage example.

FIG. 6 is a side view of a signal transmission line illustrating a usage example. As illustrated in FIG. 6, a connector 500 is attached to the signal transmission line 1. The connector 500 is connected to the terminal conductor 132 of the signal transmission line 1. The connector 500 is connected to a connector of a circuit substrate 2 to which the signal transmission line 1 is connected. An electronic component 3 is mounted on the circuit substrate 2 separately from the signal transmission line 1.

The signal transmission line 1 lies over the electronic component 3. Accordingly, the signal transmission line 1 includes bent portions BT in the middle of the extending direction (signal transmission direction) and bent along the extending direction of the signal conductor 111 (FIG. 1). The bent portion BT corresponds to a "first bent portion".

Since the signal transmission line 1 has the configuration described above, there is no portion at which the first base material 10 and the second base material 21 are not bonded to each other by the conductive bonding materials 50 on both sides of the signal conductor 111, in the extending direction (signal transmission direction) of the signal transmission line 1. Accordingly, the bent portion BT is less likely to have a local sharply bent shape in the extending direction (signal transmission direction) of the signal transmission line 1. With this, a large change in characteristic impedance in the signal transmission direction may be reduced or prevented, and deterioration in transmission characteristics of the signal transmission line 1 may be reduced or prevented. As a result, deterioration in characteristics of an electronic component module including the signal transmission line 1, the circuit substrate 2, and the electronic component 3 may be reduced or prevented.

Second Preferred Embodiment

Figure 7:
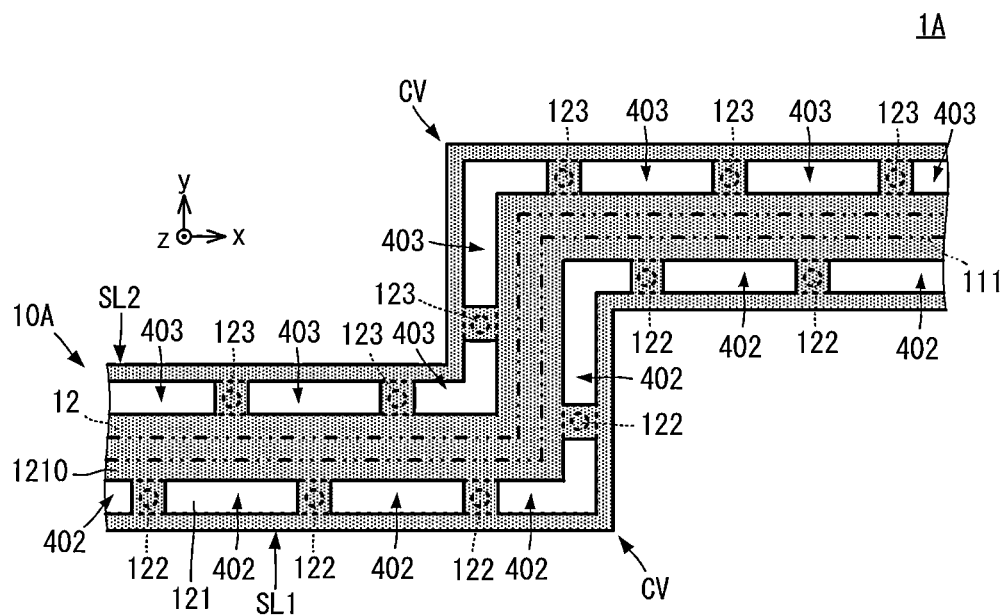
FIG. 7 is an enlarged plan view of part of a first base material of a signal transmission line according to a second preferred embodiment of the present invention.

A signal transmission line according to a second preferred embodiment of the present invention will be described with reference to the drawings. FIG. 7 is an enlarged plan view of part of a first base material 10A of a signal transmission line 1A according to the second preferred embodiment.

As illustrated in FIG. 7, the signal transmission line 1A according to the second preferred embodiment is different from the signal transmission line 1 according to the first preferred embodiment in that the first base material 10A and the second base material (not illustrated) are bent in the middle. Other configurations of the signal transmission line 1A are the same or substantially the same as those of the signal transmission line 1, and a description of the same portions is omitted.

The first base material 10A and the second base material include bent portions CV at a middle position in an extending direction. Here, the bent portion CV refers to a shape in which a direction in parallel or substantially parallel with a first side surface SL1 and a second side surface SL2 of the first base material 10A changes. The bent portion CV corresponds to a "second bent portion".

Also in the above configuration, similar to the signal transmission line 1 described above, the following holds in the signal transmission line 1A. Portions at which the first base material 10A and the second base material are not connected to each other on a side of the first side surface SL1 of the signal conductor 111, and portions at which the first base material 10A and the second base material are not connected to each other on a side of the second side surface SL2 of the signal conductor 111 do not overlap with each other. With this, the signal transmission line 1A may achieve the same or substantially the same advantageous effects as the signal transmission line 1.

Further, an opening portion 402 and an opening portion 403 are provided to correspond to the bent portions BT in the signal transmission line 1A. That is, portions at which the first base material 10A and the second base material are not connected are different from the portions at which the bent portions BT are located, and the first base material 10A and the second base material are connected by a conductive bonding material in a range corresponding to the bent portion BT. With this, the strength of the bent portion BT, which is likely to be damaged by an external force in comparison with other portions, may be increased. Accordingly, the reliability of the signal transmission line 1A increases.

Third Preferred Embodiment

Figure 8A:
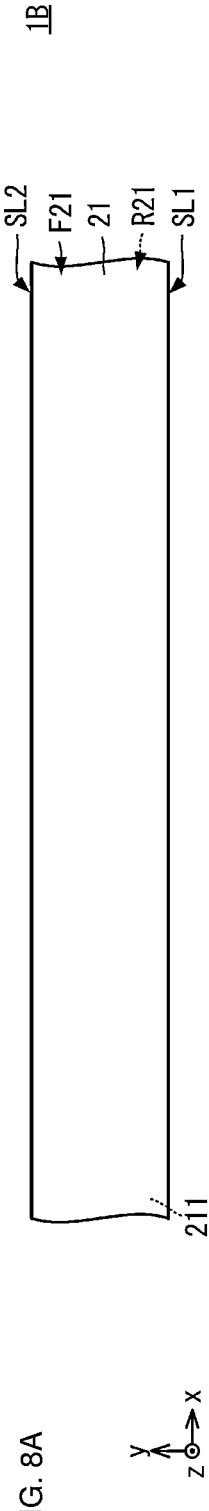
FIGS. 8A to 8E are exploded plan views of a signal transmission line according to a third preferred embodiment of the present invention.
Figure 8B:
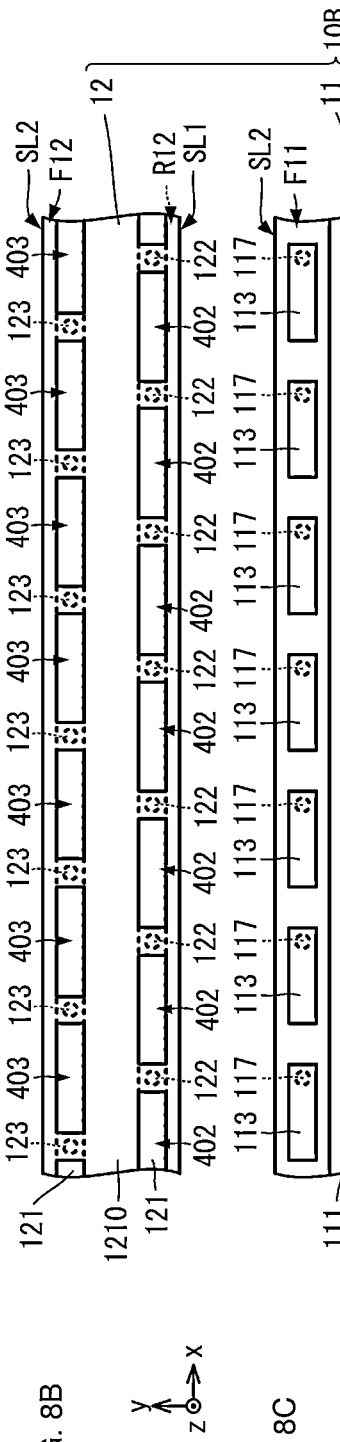
Figure 8C:
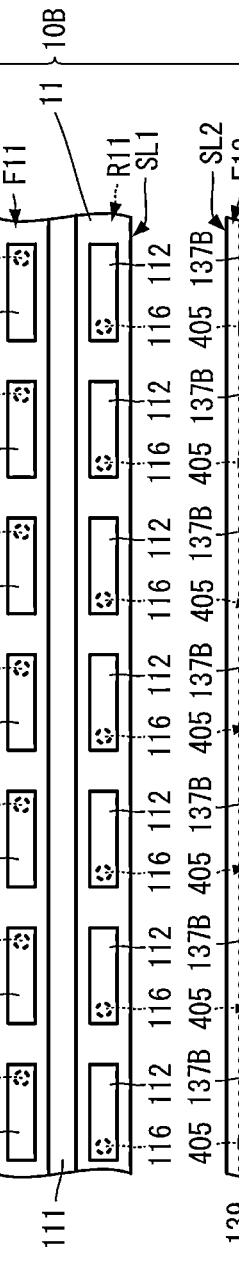
Figure 8D:
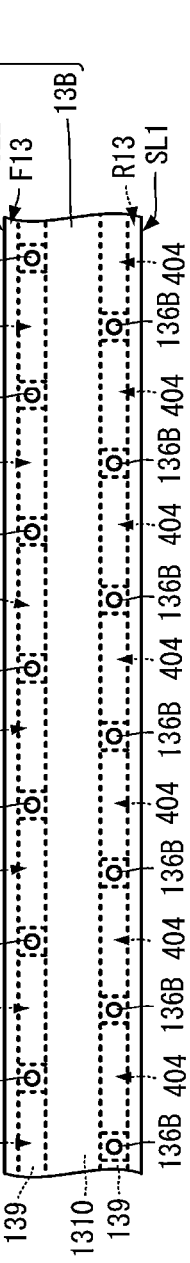
Figure 8E:
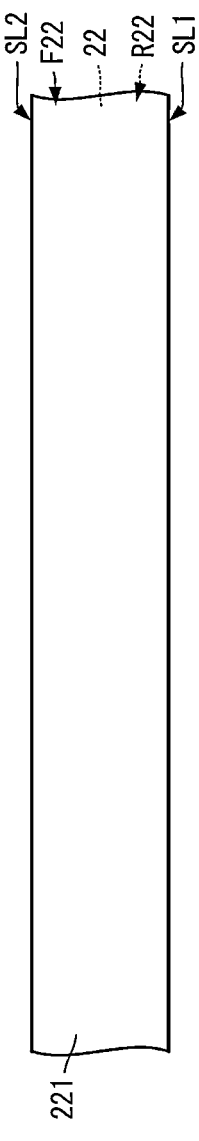
Figure 8F:
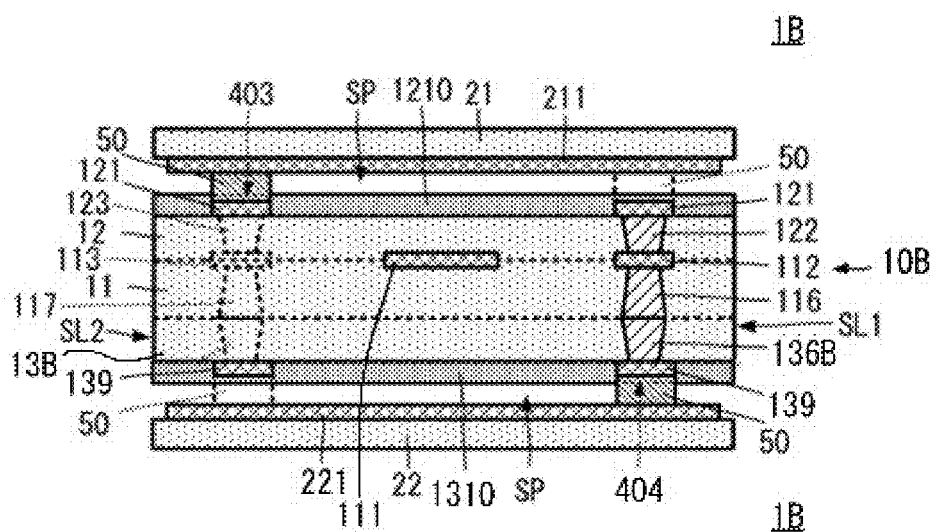
FIGS. 8F and 8G are sectional views of the signal transmission line according to the third preferred embodiment of the present invention.
Figure 8G:
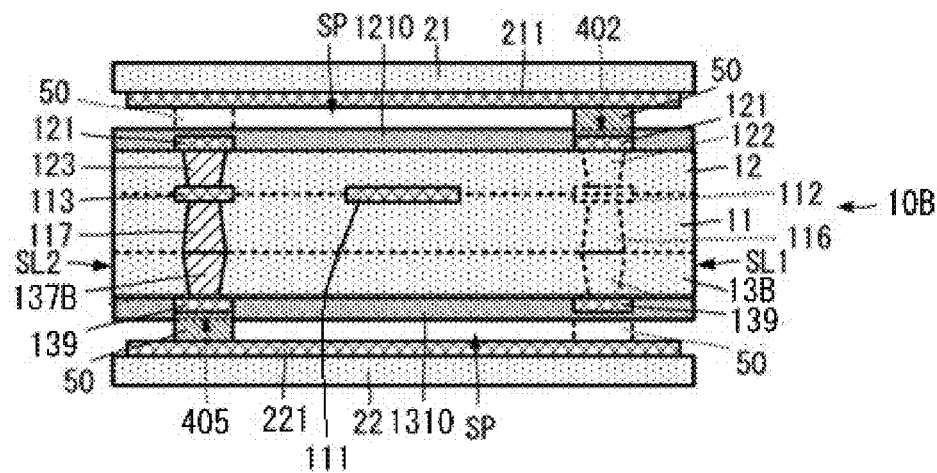

A signal transmission line according to a third preferred embodiment of the present invention will be described with reference to the drawings. FIGS. 8A to 8E are exploded plan views of a signal transmission line 1B according to the third preferred embodiment. FIGS. 8F and 8G are sectional views of the signal transmission line 1B according to the third preferred embodiment.

As illustrated in FIGS. 8A to 8G, the signal transmission line 1B according to the third preferred embodiment is different from the signal transmission line 1 according to the first preferred embodiment in the configuration of a first base material 10B, and in that a third base material 22 is included. Other configurations of the signal transmission line 1B are the same as those of the signal transmission line 1, and a description of the same portions is omitted.

The first base material 10B is preferably different from the first base material 10 in the configuration of an insulation layer 13B. The insulation layer 13B includes a first main surface F13 and a second main surface R13. The first main surface F13 of the insulation layer 13B is in contact with the second main surface R11 of an insulation layer 11.

A mounting conductor 139 is on the second main surface R13 of the insulation layer 13B. The mounting conductor 139 is preferably made of copper foil or the like, for example. The mounting conductor 139 is an annular conductor pattern and has a shape extending along an end surface, a first side surface SL1, and a second side surface SL2 of the insulation layer 13B. The mounting conductor 139 overlaps with multiple auxiliary conductors 112 and multiple auxiliary conductors 113 of the insulation layer 11 in a plan view. Further, the mounting conductor 139 does not overlap with a signal conductor 111, but surrounds the signal conductor 111 in a plan view. The mounting conductor 139 overlaps with a mounting conductor 121 in a plan view. In a plan view, a portion of the mounting conductor 139 on a side of the first side surface SL1 relative to the signal conductor 111 corresponds to a "third mounting conductor". In a plan view, a portion of the mounting conductor 139 on a side of the second side surface SL2 relative to the signal conductor 111 corresponds to a "fourth mounting conductor".

A protection film 1310 is provided on the second main surface R13 of the insulation layer 13B. The protection film 1310 has multiple opening portions 404 and multiple opening portions 405. The protection film 1310 is a resist film, for example.

The multiple opening portions 404 overlap with a portion of the mounting conductor 139 on the side of the first side surface SL1, and expose the mounting conductor 139. The multiple opening portions 404 are arranged with an interval in-between along a portion of the mounting conductor 139 that is close to the first side surface SL1 and extends along the first side surface SL1. Intervals of the multiple opening portions 404 are arranged equal to each other, for example. Further, a portion between the multiple opening portions 404 where the mounting conductor 139 is not exposed is a non-opening portion (corresponding to a "third non-mounting portion".

The multiple opening portions 405 overlap with a portion of the mounting conductor 139 on the side of the second side surface SL2, and expose the mounting conductor 139. The multiple opening portions 405 are provided with an interval in-between along a portion of the mounting conductor 139 that is close to the second side surface SL2 and extends along the second side surface SL2. Intervals of the multiple opening portions 405 are arranged equal or substantially equal to each other, for example. Further, a portion between the multiple opening portions 405 where the mounting conductor 139 is not exposed is a non-opening portion (corresponding to a "fourth non-mounting portion").

Positions of the non-opening portions between the multiple opening portions 404 and positions of the non-opening portions between the multiple opening portions 405 are different from each other, and do not overlap with each other in the extending direction (x-axis direction) of the signal conductor 111. More specifically, the positions of the non-opening portions between the multiple opening portions 404 and the positions of the non-opening portions between the multiple opening portions 405 are alternately arranged, in the extending direction of the signal conductor 111 (x-axis direction).

Furthermore, the positions of the non-opening portions of the mounting conductor 139 between the multiple opening portions 404 and the positions of non-opening portions 402N of the mounting conductor 121 between multiple opening portions 402 are different from each other, and do not overlap with each other in the extending direction (x-axis direction) of the signal conductor 111. The positions of the non-opening portions between the multiple opening portions 405 of the mounting conductor 139 and the positions of non-opening portions 403N between multiple opening portions 403 of the mounting conductor 121 are different from each other, and do not overlap with each other in the extending direction (x-axis direction) of the signal conductor 111.

Multiple interlayer connection conductors 136B and multiple interlayer connection conductors 137B are provided in the insulation layer 13B in shapes penetrating through from the first main surface F13 to the second main surface R13. The multiple interlayer connection conductors 136B and the multiple interlayer connection conductors 137B are provided by solidifying a conductive paste filled in through-holes penetrating through an insulation layer 12 in the thickness direction.

The multiple interlayer connection conductors 136B respectively overlap with the non-opening portions between the multiple opening portions 404 of the mounting conductor 139 in a plan view. First ends of the multiple interlayer connection conductors 136B are respectively connected to portions of the mounting conductor 139 overlapping with the non-opening portions. Second ends of the multiple interlayer connection conductors 136B are respectively connected to the auxiliary conductors 112 via interlayer connection conductors 116 of the insulation layer 11.

The multiple interlayer connection conductors 137B respectively overlap with the non-opening portions between the multiple opening portions 405 of the mounting conductor 139 in a plan view. First ends of the multiple interlayer connection conductors 137B are respectively connected to portions of the mounting conductor 139 overlapping with the non-opening portions. Second ends of the multiple interlayer connection conductors 137B are respectively connected to the auxiliary conductors 113 via interlayer connection conductors 117 of the insulation layer 11.

Configuration of Third Base Material 22

The basic configuration of the third base material 22 is the same as that of the second base material 21. The third base material 22 has an insulation property and flexibility. The planar shape of the third base material 22 is substantially the same as the planar shape of the first base material 10B, for example. Note that the third base material 22 is not on the first base material 10B where terminal conductors 132 are exposed.

The third base material 22 includes a main surface F22 and a main surface R22. A ground conductor 221 is provided on the main surface F22 of the third base material 22. The ground conductor 221 is provided on the entire or substantially the entire main surface F22. The ground conductor 221 is preferably formed of copper foil or the like, for example. The ground conductor 221 corresponds to a "second ground conductor".

Connection Structure between First Base Material 10B and Third Base Material 22

The first base material 10B and the third base material 22 are electrically and physically connected to each other by multiple conductive bonding materials 50 (corresponding to a "second conductive bonding material"). More specifically, the third base material 22 is on the first base material 10B such that the main surface F22 opposes the second main surface R13 (corresponding to the second main surface of the first base material 10B) of the insulation layer 13B of the first base material 10B.

Conductive bonding materials are respectively bonded to the multiple opening portions 404 and opening portions 405 provided on the mounting conductor 139. The conductive bonding materials above are also bonded to the ground conductor 221 of the third base material 22. With this, the mounting conductor 139 and the ground conductor 221 are electrically and physically connected to each other by the conductive bonding materials.

With the configuration above, the signal transmission line 1B may be a stripline transmission line in which the signal conductor 111 is sandwiched by the ground conductor 211 and the ground conductor 221 from both sides in the thickness direction (z-axis direction).

Further, in the configuration above, gaps SP are respectively formed between the first base material 10B and the second base material 21, and between the first base material 10B and the third base material 22. For example, as shown in FIGS. 8A, 8B, 8F, and 8G, a gap SP is formed between the first main surface F12 of the first base material 10B and the second base material 21, and, as shown in FIGS. 8D, 8E, 8F, and 8G, a gap SP is formed between the second main surface R13 of the first base material 10B and the third base material 22. That is, a structure may be realized in which the gaps SP are present between the signal conductor 111 and the ground conductor 211, and between the signal conductor 111 and the ground conductor 221. With this, dielectric loss may be decreased and transmission characteristics may be improved in the signal transmission line 1B.

Further, when a desired impedance line is provided, the thickness of the signal transmission line may be made smaller than a case that the gap SP is not present, with the same line width of the signal line. Furthermore, having the gaps SP allows the signal transmission line 1B to be easily bent. Here, the bending structure means that the signal transmission line 1B is bent in the middle of the extending direction such that a direction in parallel or substantially in parallel with the main surfaces (main surface of the first base material 10 and main surface of the second base material 21) of the signal transmission line 1B changes.

Further, in the configuration above, the multiple opening portions 404 and the multiple opening portions 405 are at different positions in the extending direction of the signal conductor 111.

With this, the positions on both sides of the signal conductor 111, at which the first base material 10B and the third base material 22 are not connected, do not coincide with each other. Accordingly, there is no portion at which the first base material 10B and the third base material 22 are not connected to each other in the extending direction of the signal conductor 111, that is, the extending direction of the signal transmission line 1. As a result, it is possible to prevent a portion, which is much more likely to bend relative to other portions, from being locally provided in the signal transmission direction (x-axis direction) in the signal transmission line 1B. That is, formation of a locally bent portion may be reduced or prevented, and a large change in characteristic impedance in the signal transmission direction may be reduced or prevented in the signal transmission line 1B.

Further, in the configuration above, on the side of the first side surface SL1 of the signal conductor 111, portions at which the first base material 10B and the second base material 21 are not connected and portions at which the first base material 10B and the third base material 22 are not connected do not coincide with each other. Similarly, on the side of the second side surface SL2 of the signal conductor 111, portions at which the first base material 10B and the second base material 21 are not connected and portions at which the first base material 10B and the third base material 22 are not connected do not coincide with each other. As a result, it is possible to prevent a portion, which is much more likely to bend relative to other portions, from being locally provided in the signal transmission direction (x-axis direction) in the signal transmission line 1B. That is, formation of a locally bent portion may further be reduced or prevented, and a large change in characteristic impedance in the signal transmission direction may further be reduced or prevented in the signal transmission line 1B.

Fourth Preferred Embodiment

A signal transmission line according to a fourth preferred embodiment of the present invention will be described with reference to the drawings. FIGS. 9A to 9E are exploded plan views of a signal transmission line 1C according to the fourth preferred embodiment.

As illustrated in FIGS. 9A to 9E, the signal transmission line 1C according to the fourth preferred embodiment is different from the signal transmission line 1B according to the third preferred embodiment in the shape and arrangement of opening portions 402, opening portions 403, opening portions 404, and opening portions 405. Other configurations of the signal transmission line 1C are the same as those of the signal transmission line 1B, and a description of the same or corresponding portions is omitted.

In the signal transmission line 1C, positions of the non-opening portions between the multiple opening portions 402, positions of the non-opening portions between the multiple opening portions 403, positions of the non-opening portions between the multiple opening portions 404, and positions of the non-opening portions between the multiple opening portions 405 do not coincide with each other in the extending direction of the signal conductor 111 (signal transmission direction: x-axis direction).

Accompanying with the above, positions of multiple interlayer connection conductors 122, positions of multiple interlayer connection conductors 123, positions of multiple interlayer connection conductors 136C, and positions of multiple interlayer connection conductors 137C do not coincide with each other in the extending direction of the signal conductor 111 (signal transmission direction: x-axis direction).

With this, portions at which a first base material 10C and the second base material 21 are not connected and portions at which the first base material 10C and the third base material 22 are not connected do not coincide with each other in the signal transmission direction. With this, it is possible to prevent a portion, which is much more likely to bend relative to other portions, from being locally provided in the signal transmission direction (x-axis direction) in the signal transmission line 1C. That is, formation of a locally bent portion may further be reduced or prevented, and a large change in characteristic impedance in the signal transmission direction may further be reduced or prevented in the signal transmission line 1C.

Fifth Preferred Embodiment

Figure 10:
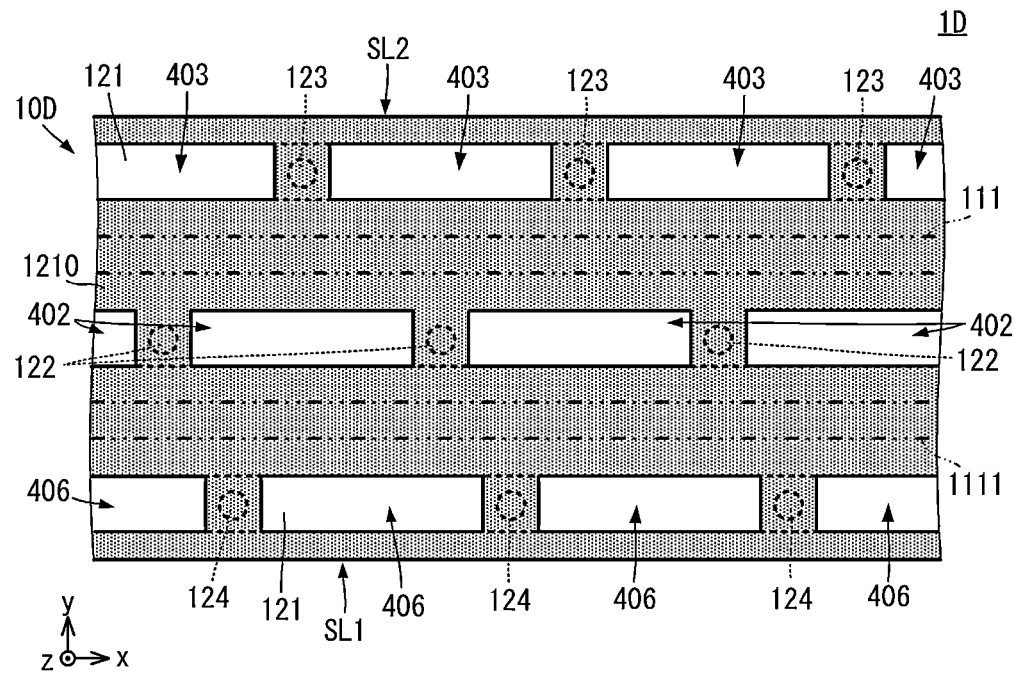
FIG. 10 is a partially enlarged plan view of a first base material of a signal transmission line according to a fifth preferred embodiment of the present invention.

A signal transmission line according to a fifth preferred embodiment of the present invention will be described with reference to the drawings. FIG. 10 is a partially enlarged plan view of a first base material 10D of a signal transmission line 1D according to the fifth preferred embodiment.

As illustrated in FIG. 10, the signal transmission line 1D according to the fifth preferred embodiment is different from the signal transmission line 1 according to the first preferred embodiment in that multiple signal conductors (signal conductor 111 and signal conductor 1111) are included, and multiple opening portions 406 and interlayer connection conductors 124 are included corresponding to the configuration with the multiple signal conductors.

The signal conductor 1111 is between the signal conductor 111 and a first side surface SL1 on the first base material 10D. The signal conductor 1111 extends in parallel with the signal conductor 111. The signal conductor 1111 corresponds to a "second signal conductor".

In a plan view, multiple opening portions 402 are between the signal conductor 111 and the signal conductor 1111, and interlayer connection conductors 122 are structured to overlap with non-opening portions between the opening portions 402.

In a plan view, the multiple opening portions 406 to expose a mounting conductor 121 are between the signal conductor 1111 and the first side surface SL1, and the interlayer connection conductors 124 are formed to overlap with non-opening portions between the opening portions 406. A portion of the mounting conductor 121 between the signal conductor 1111 and the first side surface SL1 corresponds to a "fifth mounting conductor", and a non-opening portion arranged between the portions corresponds to a "fifth non-mounting portion".

In the configuration above, positions of the non-opening portions between the multiple opening portions 402, positions of non-opening portions between multiple opening portions 403, and positions of the non-opening portions between the multiple opening portions 406 do not coincide with each other in the signal transmission direction (x-axis direction).

With the configuration above, even in a configuration in which multiple signal conductors extend in parallel with each other, formation of a locally bent portion may be reduced or prevented, and a large change in characteristic impedance in a signal transmission direction may be reduced or prevented in the signal transmission line 1D.

Note that, although an aspect is described in the present preferred embodiment in which two signal conductors extend in parallel with each other, the same configuration may be applied to a case of three or more signal conductors, and the same effects may be obtained.

Sixth Preferred Embodiment

Figure 11:
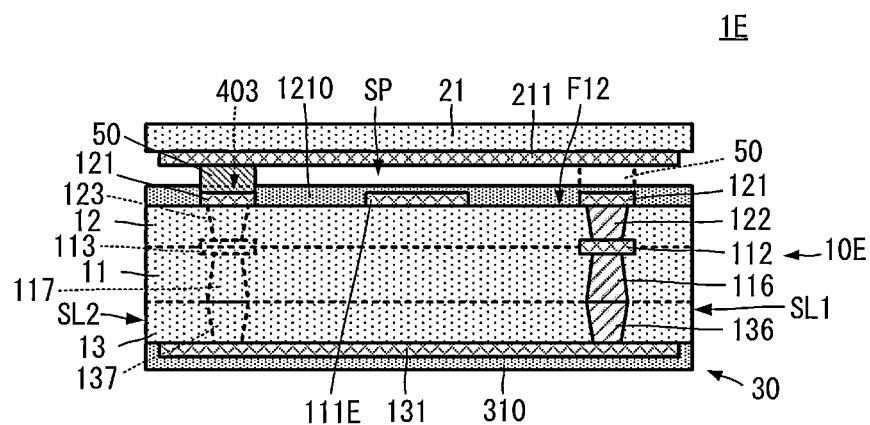
FIG. 11 is a sectional view of a signal transmission line according to a sixth preferred embodiment of the present invention.

A signal transmission line according to a sixth preferred embodiment of the present invention will be described with reference to the drawings. FIG. 11 is a sectional view of a signal transmission line 1E according to the sixth preferred embodiment.

As illustrated in FIG. 11, the signal transmission line 1E according to the sixth preferred embodiment is different from the signal transmission line 1 according to the first preferred embodiment in a position where a signal conductor 111E is disposed. Other configurations of the signal transmission line 1E are the same as those of the signal transmission line 1, and a description of the same portions is omitted.

The signal conductor 111E is on a first main surface F12 of an insulation layer 12. The signal conductor 111E corresponds to the "first signal conductor".

The signal conductor 111E is a linear conductor extending in the x-axis direction. The signal conductor 111E is at a center or substantially a center position of the insulation layer 12 in the y-axis direction. In other words, the signal conductor 111E is between a first side surface SL1 and a second side surface SL2 of the insulation layer 12.

Interlayer connection conductors 115 (not illustrated in FIG. 11) are provided in the insulation layer 12 in shapes penetrating through from the first main surface F12 to the second main surface R12. The multiple interlayer connection conductors 115 are provided by solidifying a conductive paste filled in through-holes penetrating through the insulation layer 12 in the thickness direction.

The interlayer connection conductors 115 overlap with respective ends of the signal conductor 111E in a plan view. First ends of the interlayer connection conductors 115 are respectively connected to the signal conductor 111E.

Further, in the configuration above, similar to the signal transmission line 1 according to the first preferred embodiment, portions on both sides of the signal conductor 111E, at which a first base material 10E and the second base material 21 are not connected, do not coincide with each other. Accordingly, presence of a large portion, at which the first base material 10E and the second base material 21 are not connected to each other, is reduced or prevented in an extending direction of the signal conductor 111E, that is, in an extending direction of the signal transmission line 1E. As a result, it is possible to prevent a portion, which is much more likely to bend relative to other portions, from being locally provided in the signal transmission direction (x-axis direction) in the signal transmission line 1E. That is, formation of a locally bent portion may be reduced or prevented, and a large change in characteristic impedance in the signal transmission direction may be reduced or prevented in the signal transmission line 1E.

Note that, in the sixth preferred embodiment, the signal conductor 111E is on the first main surface F12 of the insulation layer 12. However, the signal conductor 111E may be on a second main surface R13 of an insulation layer 13. In the case above, openings are provided in a ground conductor 131 provided on the second main surface R13, and the ground conductor 131 and the signal conductor 111E do not overlap with each other in a plan view. Further, the signal conductor 111E may be on the second main surface R13 of the insulation layer 13 in other preferred embodiments.

The configurations of the preferred embodiments described above can appropriately be combined with each other, and effects corresponding to the respective combinations can be achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal transmission line, comprising:
   a first base material including a first main surface, a second main surface, a first side surface, and a second side surface and including a first signal conductor;
   a second base material, opposing the first main surface, on which a first ground conductor is located; and
   multiple first conductive bonding materials to bond the first base material and the second base material such that a gap is present between the first main surface and the second base material is present; wherein
   the first base material includes multiple first mounting conductors and multiple second mounting conductors, to which the multiple first conductive bonding materials are respectively bonded, on the first main surface;
   the multiple first mounting conductors extend in parallel or substantially in parallel with the first signal conductor, include multiple first non-mounting portions arranged with an interval in-between, and are on a side of the first side surface relative to the first signal conductor;
   the multiple second mounting conductors extend in parallel or substantially in parallel with the first signal conductor, include multiple second non-mounting portions arranged with an interval in-between, and are on a side of the second side surface relative to the first signal conductor; and
   positions of the multiple first non-mounting portions are different from positions of the multiple second non-mounting portions in an extending direction of the first signal conductor.

2. The signal transmission line according to claim 1, further comprising:
   a third base material, opposing the second main surface, on which a second ground conductor is located; and
   multiple second conductive bonding materials to bond the first base material and the third base material such that a gap between the second main surface and the third base material is present; wherein
   the first base material includes multiple third mounting conductors and multiple fourth mounting conductors, to which the multiple second conductive bonding materials are respectively bonded, on the second main surface;
   the multiple third mounting conductors extend in parallel with the first signal conductor, include multiple third non-mounting portions arranged with an interval in-between, and are on a side of the first side surface relative to the first signal conductor;
   the multiple fourth mounting conductors extend in parallel with the first signal conductor, include multiple fourth non-mounting portions arranged with an interval in-between, and are on a side of the second side surface relative to the first signal conductor; and
   positions of the multiple third non-mounting portions are different from positions of the multiple fourth non-mounting portions in the extending direction of the first signal conductor.

3. The signal transmission line according to claim 2, wherein
   in the extending direction of the first signal conductor:
     the positions of the multiple first non-mounting portions are different from the positions of the multiple third non-mounting portions; and
     the positions of the multiple second non-mounting portions are different from the positions of the multiple fourth non-mounting portions.

4. The signal transmission line according to claim 3, wherein
in the extending direction of the first signal conductor, the positions of the multiple first non-mounting portions, the positions of the multiple second non-mounting portions, the positions of the multiple third non-mounting portions, and the positions of the multiple fourth non-mounting portions are different from each other.

5. The signal transmission line according to claim 2, wherein
the second ground conductor is provided to cover substantially an entirety of the third base material.

6. The signal transmission line according to claim 1, further comprising:
a second signal conductor extending in parallel with the first signal conductor and on a side of the first side surface relative to the multiple first mounting conductors; and
multiple fifth mounting conductors on the first main surface, to which the multiple first conductive bonding materials are respectively bonded; wherein
the multiple fifth mounting conductors extend in parallel with the second signal conductor, and have multiple fifth non-mounting portions arranged with an interval in-between; and
in the extending direction of the first signal conductor and the second signal conductor, positions of the multiple fifth non-mounting portions are different from the positions of the multiple first non-mounting portions and the positions of the multiple second non-mounting portions.

7. The signal transmission line according to claim 1, further comprising:
a first bent portion bending to change a direction in parallel with the first main surface and the second main surface along the extending direction of the first signal conductor.

8. The signal transmission line according to claim 1, further comprising:
a second bent portion bending to change a direction in parallel with the first side surface and the second side surface along the extending direction of the first signal conductor; wherein
the first non-mounting portions and the second non-mounting portions are arranged at positions different from the second bent portion.

9. The signal transmission line according to claim 1, wherein
the first base material includes multiple insulation layers which possess flexibility.

10. The signal transmission line according to claim 1, wherein
portions bonded by the first conductive bonding materials on a first side of the first signal conductor and portions bonded by the first conductive bonding materials on a second side of the first signal conductor are arranged to both partially overlap with each other and not overlap with each other in some areas along the extending direction of the first signal conductor.

11. The signal transmission line according to claim 1, further comprising:
multiple interlayer connection conductors on the first base material and having a shape extending in a direction orthogonal to the first main surface; wherein
the multiple interlayer connection conductors overlap with the first non-mounting portions and the second non-mounting portions.

12. The signal transmission line according to claim 11, wherein
the multiple interlayer connection conductors are located along the first side surface of the first base material.

13. The signal transmission line according to claim 11, wherein
the first base material includes multiple opening portions defined therein.

14. The signal transmission line according to claim 13, wherein
one of the multiple opening portions is defined at a location overlapping with the first signal conductor.

15. The signal transmission line according to claim 14, wherein
the multiple opening portions are arranged with an interval in-between along the first side surface.

* * * * *